(12) United States Patent
Niki et al.

(10) Patent No.: US 8,111,543 B2
(45) Date of Patent: Feb. 7, 2012

(54) SEMICONDUCTOR MEMORY DEVICE

(75) Inventors: Yusuke Niki, Tokyo (JP); Keiichi Kushida, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 12/719,737

(22) Filed: Mar. 8, 2010

(65) Prior Publication Data
US 2011/0007557 A1   Jan. 13, 2011

(30) Foreign Application Priority Data

Jul. 10, 2009  (JP) .................................. 2009-163948

(51) Int. Cl.
*G11C 11/00* (2006.01)
*G11C 8/00* (2006.01)

(52) U.S. Cl. .................................. 365/154; 365/230.05
(58) Field of Classification Search .................. 365/154, 365/230.05, 156
See application file for complete search history.

(56) References Cited

U.S. PATENT DOCUMENTS

| | | | | |
|---|---|---|---|---|
| 6,091,626 | A * | 7/2000 | Madan | 365/154 |
| 7,400,523 | B2 * | 7/2008 | Houston | 365/154 |
| 7,983,071 | B2 * | 7/2011 | Houston | 365/154 |
| 2010/0142258 | A1 * | 6/2010 | Tsai et al. | 365/154 |

FOREIGN PATENT DOCUMENTS

| | | |
|---|---|---|
| JP | 2008-293591 | 12/2008 |
| JP | 2009-043304 | 2/2009 |

OTHER PUBLICATIONS

Ik Joon Chang et al.,"A 32kb 10T Subthreshold SRAM Array with Bit-Interleaving and Differential Read Scheme in 90nm CMOS," ISSCC Dig. Tech. Papers, pp. 388-390, Feb. 2008.
Background Art Information.

* cited by examiner

*Primary Examiner* — Anh Phung
(74) *Attorney, Agent, or Firm* — Knobbe, Martens, Olson & Bear, LLP

(57) ABSTRACT

An SRAM cell includes one pair of drive transistors, one pair of load transistors, one pair of write access transistors, one pair of read drive transistors, and one pair of access transistors. A voltage source potential is supplied to drains of the read drive transistors.

20 Claims, 17 Drawing Sheets

SEMICONDUCTOR MEMORY DEVICE

CROSS REFERENCE TO RELATED APPLICATION

This application is based upon and claims the benefit of priority from the prior Japanese Patent Application No. P2009-163948, filed on Jul. 10, 2009, the entire contents of which are incorporated herein by reference.

FIELD OF THE INVENTION

The invention relates to a semiconductor memory device, in particular, a semiconductor memory device having an SRAM cell configured by 10 transistors.

DESCRIPTION OF THE BACKGROUND

Since an SRAM (static random access memory) does not require a refresh operation, a power consumption of the SRAM is lower than that of a DRAM (dynamic random access memory), and an operation speed of the SRAM is higher than that of the DRAM. For this reason, the SRAM is widely used for a cache memory of a computer or a mobile electronic appliance. Memory cells used in the SRAM include a high-resistance type cell and a CMOS type cell. The CMOS type cell is configured by six transistors, i.e., one pair of access transistors, one pair of drive transistors, and one pair of load transistors.

A method of relieving read disturbance by configuring an SRAM cell with 10 transistors obtained by adding one pair of read access transistors and one pair of read drive transistors to a CMOS type cell configured by six transistors is known. The relieving method is disclosed in Japanese Patent Application Publication No. 2009-43304.

In the relieving method, a serial buffering N-channel MOS transistor is connected between an access transistor of an SRAM cell and a bit line corresponding to the access transistor, and an intermediate node drive N-channel MOS transistor is connected between a connection node of series transistors and a low-side power supply, for example. The intermediate node drive transistor connects a gate to a storage node which is the same as a corresponding drive transistor. In the relieving method, the SRAM cell is configured by 10 transistors and improves at least a read margin even at a low power supply voltage.

A method in which first and second word lines commonly arranged in a plurality of memory cells, a plurality of power supply lines arranged to correspond to the plurality of memory cells, respectively, a plurality of pairs of first and second bit lines arranged to correspond to the plurality of memory cells, a row decoder which sequentially activates the first word line and the second word line when data is written, and a control circuit which sets a power supply line of a selected memory cell in a floating state when data is written and sets power supply lines of non-selected memory cells to a ground voltage are arranged to configure an SRAM with 10 transistors and to further improve the stability of data retention in a memory cell is also known. The stability improving method is disclosed in Japanese Patent Application Publication No. 2008-293591.

Relief of read disturbance and improvement of stability of data retention are disclosed in I. J. Chang et al., "A 32 kb 10T Subthreshold SRAM Array with Bit-Interleaving and Differential Read Scheme in 90 nm CMOS", ISSCC Dig. Tech. Paper, Feb. 2008, pp. 388 to 389.

However, in the SRAM cell configured by the 10 transistors, source potentials of a read drive transistor must be switched when data is read and when data is written, therefore, a current consumption is disadvantageously increased.

For example, when a current of 40 μA is consumed per SRAM cell, and when 128 SRAM cells are connected to each row, a current of 5 mA flows in a common source line commonly connected to sources of read drive transistors of the SRAM cells in the row direction by one switching operation when data is read. For this reason, a sufficiently thick wire is required to secure reliability to electromigration or to suppress a voltage drop caused by a wiring resistance. When a cell array increases in scale, a cell area disadvantageously increases. Since sources of a large number of read ports are connected to the common source line, a parasitic capacitance increases, a power consumption increases, and an operation speed disadvantageously decreases.

SUMMARY OF THE INVENTION

According to an aspect of the invention is provided a semiconductor memory device, comprising a memory cell to write and read data, wherein the memory cell includes, a first inverter having a first load transistor and a first drive transistor connected in series, a second inverter having a second load transistor and a second drive transistor connected in series, having an output connected to an input of the first inverter, and having an input connected to an output of the first inverter, a first write access transistor having a drain connected to a gate of the second drive transistor, a gate of the second load transistor, a drain of the first drive transistor, and a drain of the first load transistor, a second write access transistor having a drain connected to a drain of the second drive transistor, a drain of the second load transistor, a gate of the first drive transistor, and a gate of the first load transistor, a first access transistor having a drain connected to a source of the first write access transistor, a second access transistor having a drain connected to a source of the second write access transistor, a first read drive transistor having a source connected to the source of the first write access transistor, having a gate connected to the drain of the first write access transistor, and having a drain to a voltage source potential supplied, a second read drive transistor having a source connected to the source of the second write access transistor, having a gate connected to the drain of the second write access transistor, and having a drain to the voltage source potential supplied, a write word line connected to a gate of the first write access transistor and a gate of the second write access transistor, a read word line connected to a gate of the first access transistor and a gate of the second access transistor, a first bit line connected to a source of the first access transistor, and a second bit line connected to a source of the second access transistor.

According to another aspect of the invention is provided a semiconductor memory device, comprising a memory cell to write and read data, wherein the memory cell includes, a first inverter having a first load transistor and a first drive transistor connected in series, a second inverter having a second load transistor and a second drive transistor connected in series, having an output connected to an input of the first inverter, and having an input connected to an output of the first inverter, a first write access transistor having a drain connected to a gate of the second drive transistor, a gate of the second load transistor, a drain of the first drive transistor, and a drain of the first load transistor, a second write access transistor having a drain connected to a drain of the second drive transistor, a drain of the second load transistor, a gate of the first drive transistor, and a gate of the first load transistor, a first access transistor having a drain connected to a source of the first write access transistor, a second access transistor having a drain connected to a source of the second write access transistor, a first read drive transistor having a source connected to the source of the first write access transistor, having a gate connected to the drain of the first write access transistor, and having a drain connected to a secondary voltage source line, a second read drive transistor having a source connected to the source of the second write access transistor, having a gate connected to the drain of the second write access transistor, and having a drain connected to the secondary voltage source line, a write word line connected to a gate of the first write access transistor and a gate of the second write access transistor, a read word line connected to a gate of the first access transistor and a gate of the second access transistor, a first bit line connected to a source of the first access transistor, and a second bit line connected to a source of the second access transistor.

According to another aspect of the invention is provided a semiconductor memory device, comprising a memory cell to write and read data, wherein the memory cell includes, a first inverter having a first load transistor and a first drive transistor connected in series, a second inverter having a second load transistor and a second drive transistor connected in series, having an output connected to an input of the first inverter, and having an input connected to an output of the first inverter, a first write access transistor having a drain connected to a gate of the second drive transistor, a gate of the second load transistor, a drain of the first drive transistor, and a drain of the first load transistor, a second write access transistor having a drain connected to a drain of the second drive transistor, a drain of the second load transistor, a gate of the first drive transistor, and a gate of the first load transistor, a first access transistor having a drain connected to a source of the first write access transistor, a second access transistor having a drain connected to a source of the second write access transistor, a first read drive transistor having a drain connected to the source of the first write access transistor, having a gate connected to a gate of the first load transistor, and having a source connected to a secondary voltage source line, a second read drive transistor having a drain connected to the source of the second write access transistor, having a gate connected to a gate of the second load transistor, and having a source connected to the secondary voltage source line, a write word line connected to a gate of the first write access transistor and a gate of the second write access transistor, a read word line connected to a gate of the first access transistor and a gate of the second access transistor, a first bit line connected to a source of the first access transistor, and a second bit line connected to a source of the second access transistor.

DETAILED DESCRIPTION OF THE INVENTION

Semiconductor memory devices according to embodiments of the invention will be described with reference to the drawings.

Figure 1:
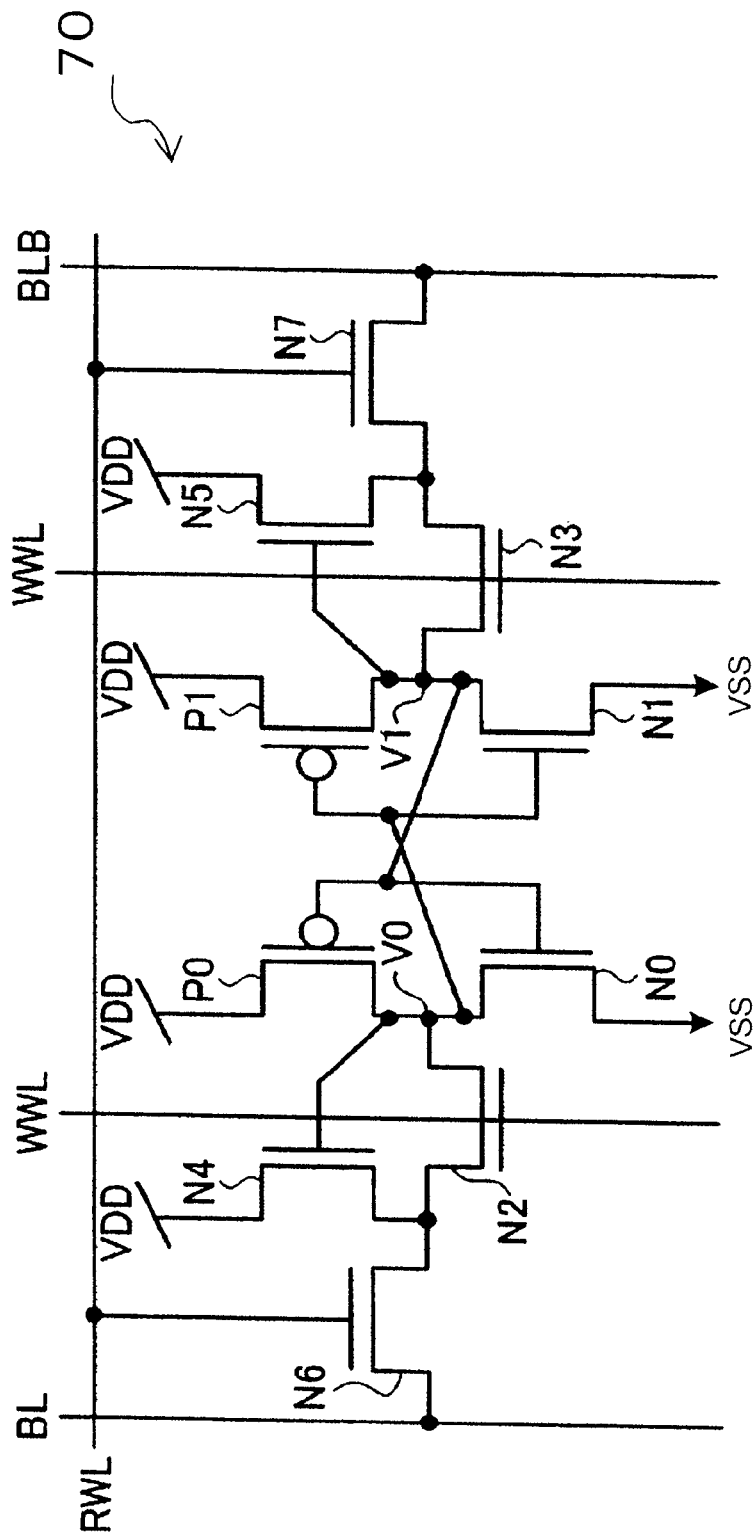
FIG. 1 is a circuit diagram showing a schematic configuration of a memory cell of a semiconductor memory device according to a first embodiment of the invention.

A semiconductor memory device according to a first embodiment of the invention will be described with reference to the drawings. FIG. 1 is a circuit diagram showing a schematic configuration of a memory cell of the semiconductor memory device. In the embodiment, a voltage source potential VDD is supplied to sources of one pair of load transistors and drains of one pair of read drive transistors of a memory cell of an SRAM (static random access memory) configured by 10 transistors.

As shown in FIG. 1, an SRAM cell 70 used in the semiconductor memory device includes one pair of drive transistors N0, N1, one pair of load transistors P0, P1, one pair of write access transistors N2, N3, one pair of read drive transistors N4, N5, and one pair of access transistors N6, N7.

As the load transistors P0, P1, P-channel insulated gate field effect transistors are used. As the drive transistors N0, N1, the write access transistors N2, N3, the read drive transistors N4, N5, and the access transistors N6, N7, N-channel insulated gate field effect transistors are used.

Here, the insulated gate field effect transistor is called a MOS transistor or a MIS transistor. The MOS transistor is also called a MOSFET (Metal Oxide Semiconductor Field Effect Transistor). The MOSFET has a gate insulating film constituted of a silicon oxide film ($SiO_2$). The MIS transistor is also called a MISFET (Metal Insulator Semiconductor Field Effect Transistor). The MISFET has a gate insulating film constituted of a composite film including a silicon oxide film ($SiO_2$) and another insulating film or constituted of an insulating film or the like except for a silicon oxide film (SiO2).

In the SRAM cell 70, a write word line WWL, a read word line RWL, and one pair of bit lines BL, BLB are arranged. The write word line WWL and one pair of bit lines BL, BLB can be arranged in parallel to each other. The read word line RWL can be arranged orthogonally to the write word line WWL.

The drive transistor N0 and the load transistor P0 are connected in series with each other to configure a CMOS inverter. The drive transistor N1 and the load transistor P1 are connected in series with each other to configure a CMOS inverter. Outputs and inputs of one pair of CMOS inverters are cross-coupled with each other to configure a flip-flop. A voltage source potential VDD is supplied to the sources of the load transistors P0 and P1. A lower voltage source potential VSS having a voltage lower than that of the higher voltage source potential VDD is supplied to the sources of the drive transistors N0, N1. The voltage source potential VSS may be a ground potential.

At a connection point of the gate of the drive transistor N1, the gate of the load transistor P1, the drain of the drive transistor N0, and the drain of the load transistor P0, one storage node V0 of the flip-flop is configured.

At a connection point of the gate of the drive transistor N0, the gate of the load transistor P0, the drain of the drive transistor N1, and the drain of the load transistor P1, the other storage node V1 of the flip-flop is configured.

The drain of the write access transistor N2 is connected to the storage node V0, and the drain of the write access transistor N3 is connected to the storage node V1.

The source of the write access transistor N2 is connected to the drain of the access transistor N6. The source of the write access transistor N3 is connected to the drain of the access transistor N7.

The source of the write access transistor N2 is connected to the source of the read drive transistor N4. The drain of the write access transistor N2 is connected to the gate of the read drive transistor N4. The voltage source potential VDD is supplied to the drain of the read drive transistor N4.

The source of the write access transistor N3 is connected to the source of the read drive transistor N5. The drain of the write access transistor N3 is connected to the gate of the read drive transistor N5. The voltage source potential VDD is supplied to the drain of the read drive transistor N5.

The gates of the write access transistors N2, N3 are connected to the write word line WWL. The gates of the access transistors N6, N7 are connected to the read word line RWL.

The source of the access transistor N6 is connected to the bit line BL. The source of the access transistor N7 is connected to the bit line BLB.

Figure 2:
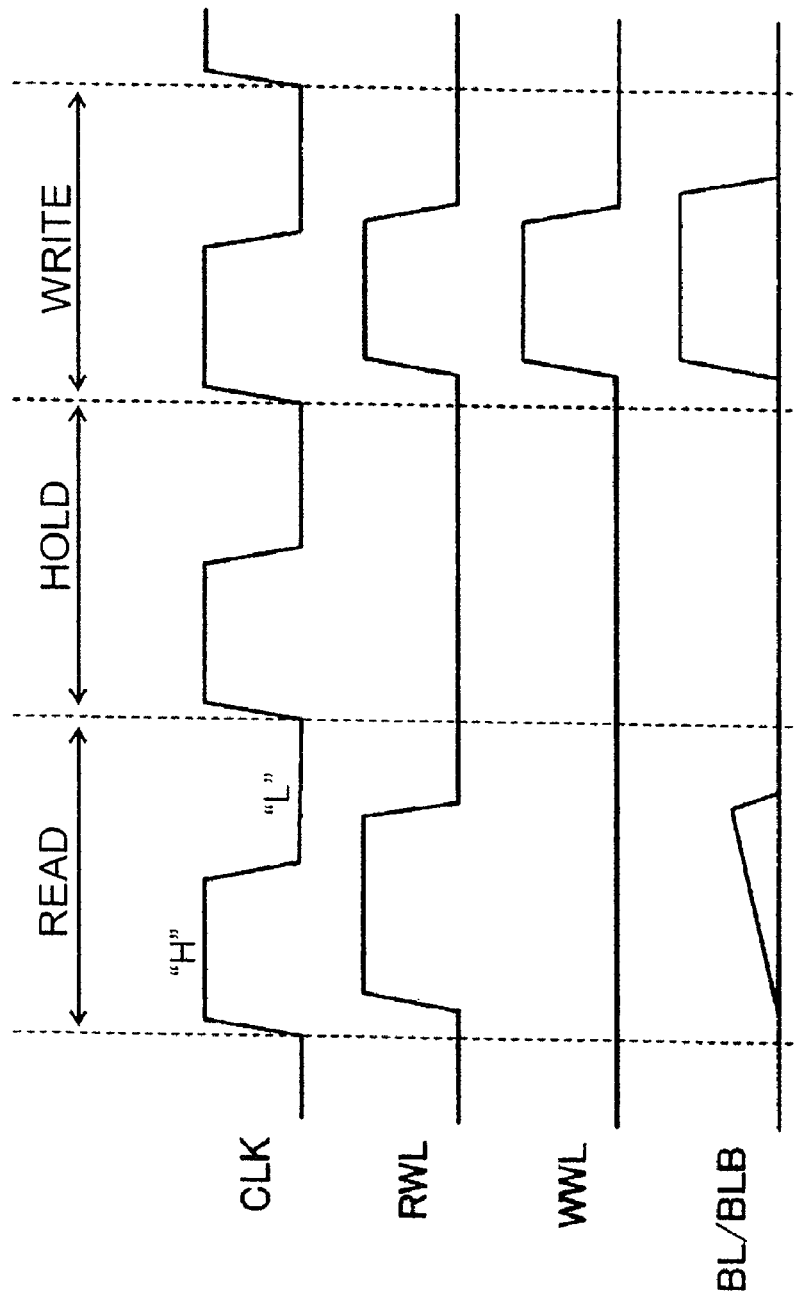
FIG. 2 is a timing chart showing waveforms of units in an operation state of the semiconductor memory device according to the first embodiment of the invention.

An operation of the semiconductor memory device will be explained with reference to FIG. 2. FIG. 2 is a timing chart showing waveforms of units in an operation state of a semiconductor memory device in which the SRAM cell 70 is arranged.

As shown in FIG. 2, when data is read from the SRAM cell 70, the potential of the bit lines BL, BLB are set to a low level. The potential of the write word line WWL is set to a low level. In the SRAM cell 70, when the potential of the read word line RWL shifts from a low level to a high level in accordance with a clock signal CLK, the access transistors N6, N7 are turned on, and the sources of the read drive transistors N4, N5 are electrically connected to the bit lines BL, BLB, respectively.

When the source of the read drive transistor N4 is electrically connected to the bit line BL, the read drive transistor N4 is driven depending on a potential of the storage node V0, and the potential of the bit line BL changes depending on the potential of the storage node V0. In this manner, data stored in the SRAM cell 70 is read.

When the source of the read drive transistor N5 is electrically connected to the bit line BLB, the read drive transistor N5 is driven depending on the potential of the storage node V1, and the potential of the bit line BLB changes depending on the potential of the storage node V1. In this manner, data stored in the SRAM cell 70 is read.

When data is written in the SRAM cell 70, depending on the write data, the potential of one of the bit lines BL, BLB is set to a low level, and the potential of the other of the bit lines BL, BLB is set to a high level. In the SRAM cell 70, when the potentials of the read word line RWL and the write word line WWL shift from a low level to a high level in accordance with the clock signal CLK, the access transistors N6, N7 and the write access transistors N2, N3 are turned on, the storage node V0 is electrically connected to the bit line BL, and the storage node V1 is electrically connected to the bit line BLB.

When the storage nodes V0, V1 are electrically connected to the bit lines BL, BLB, respectively, the potentials of the storage nodes V0, V1 change depending on the potentials of the bit lines BL, BLB. When the potential of the storage node V0 and the potential of the storage node V1 go to a high level and a low level, respectively, a logic value '1' is written in the SRAM cell 70. When the potential of the storage node V0 and the potential of the storage node V1 go to a low level and a high level, respectively, a logic value '0 (zero)' is written in the SRAM cell 70.

In this case, by an addition of the read drive transistors N4, N5 and the access transistors N6, N7, data can be read from the SRAM cell 70 while preventing the drains of the drive transistors N0, N1 and the drains of the load transistors P0, P1 from being electrically connected to the bit lines BL, BLB. As a result, read disturbance can be relieved.

When the voltage source potential VDD is supplied to the drains of the read drive transistors N4, N5, the read drive transistors N4, N5 can be driven without changing the potentials of the drains of the read drive transistors N4, N5 when the data is read from the SRAM cell 70. For this reason, a read current from the SRAM cell 70 can be secured. As a result, the drain potentials of the read drive transistors N4, N5 need not be switched in a data read state and a data write state, and a current consumption can be suppressed from being increased while relieving read disturbance.

Figure 3:
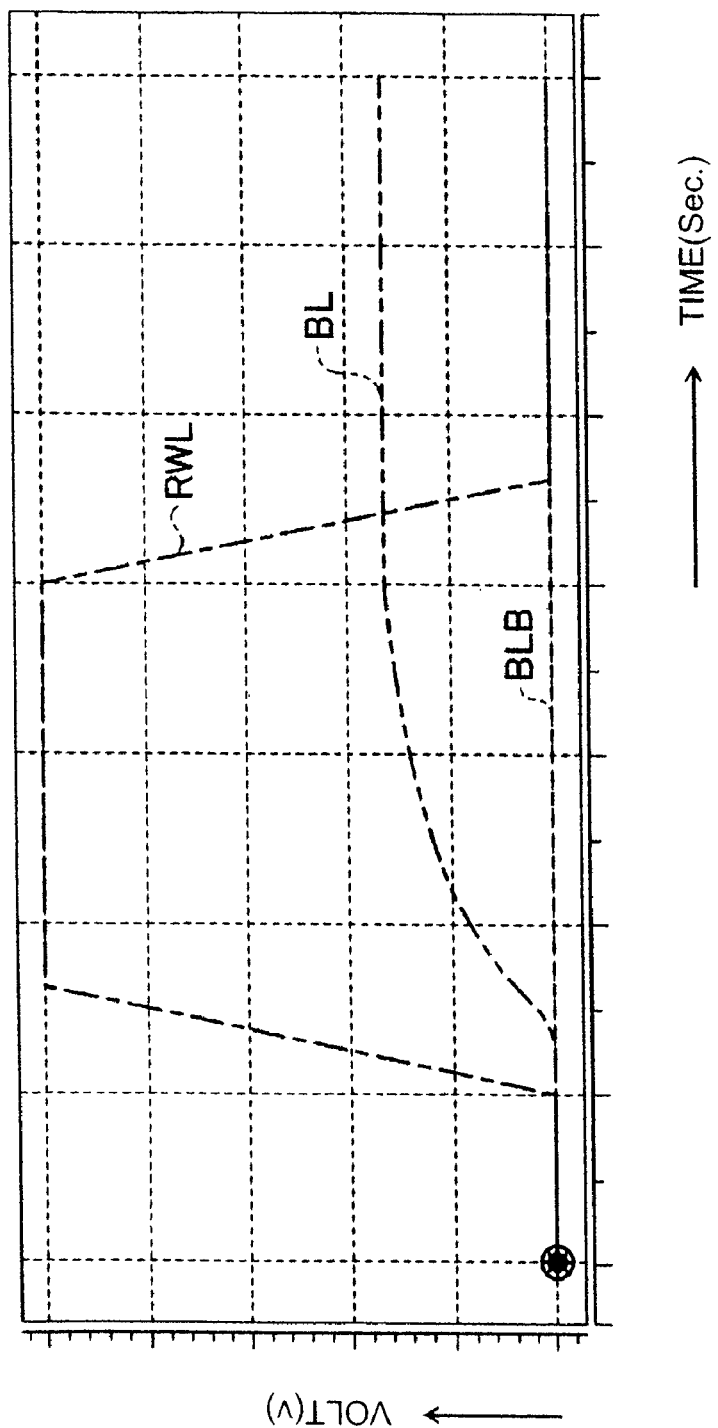
FIG. 3 is a diagram showing a simulation result of rising of a bit line potential in a data read state of the semiconductor memory device according to the first embodiment of the invention.

Rising of a bit line potential in a data read state of the semiconductor memory device will be described with reference to FIGS. 3 and 4. FIG. 3 is a diagram showing a simulation result of rising of a bit line potential in a data read state of the semiconductor memory device, and FIG. 4 is an enlarged diagram showing the waveform in FIG. 3.

Figure 4:
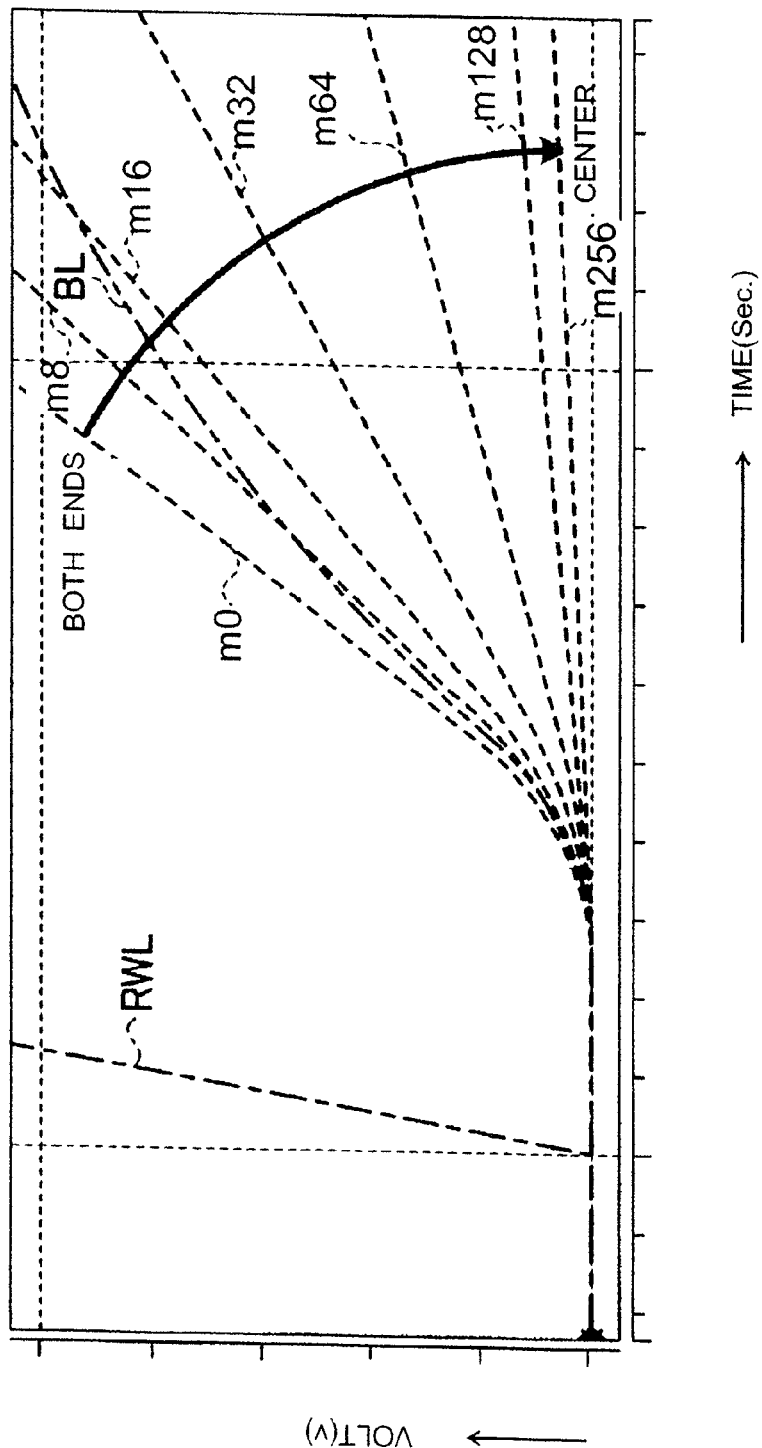
FIG. 4 is an enlarged diagram showing the waveform of FIG. 3.

As shown in FIGS. 3 and 4, when the read word line RWL shifts from a low level to a high level, data is read from the SRAM cell 70, and the potentials between the bit lines BL, BLB become different from each other.

In a method in which the source potentials of the read drive transistors N4, N5 are switched in the data read state and the data write state, when 512 SRAM cells are connected to common source lines of each of the rows, voltage rising caused by resistances of the common source lines occurs at positions which are closer to the centers of the common source lines. For this reason, the closer a position gets to the center of the common source line, the lower a read current at the position becomes. Rising of potentials of the bit line BL at the center is later than that at both the ends (m0→m8→m16→m32→m64→m128→m256). Reference symbol m8, for example, mentioned here denotes the eighth SRAM cell from both the ends.

In contrast to this, in a method in which the drains of the read drive transistors N4, N5 are connected to the voltage source potential VDD, the drain potentials of the read drive transistors N4, N5 need not be switched in a data read state and a data write state. For this reason, a read current from the SRAM cell 70 can be secured without depending on a position of the SRAM cell 70 in a row direction. Rising of the potential of the bit line BL of the SRAM cell 70 can be prevented from being later at the center portion than at both the end portions.

Figure 5:
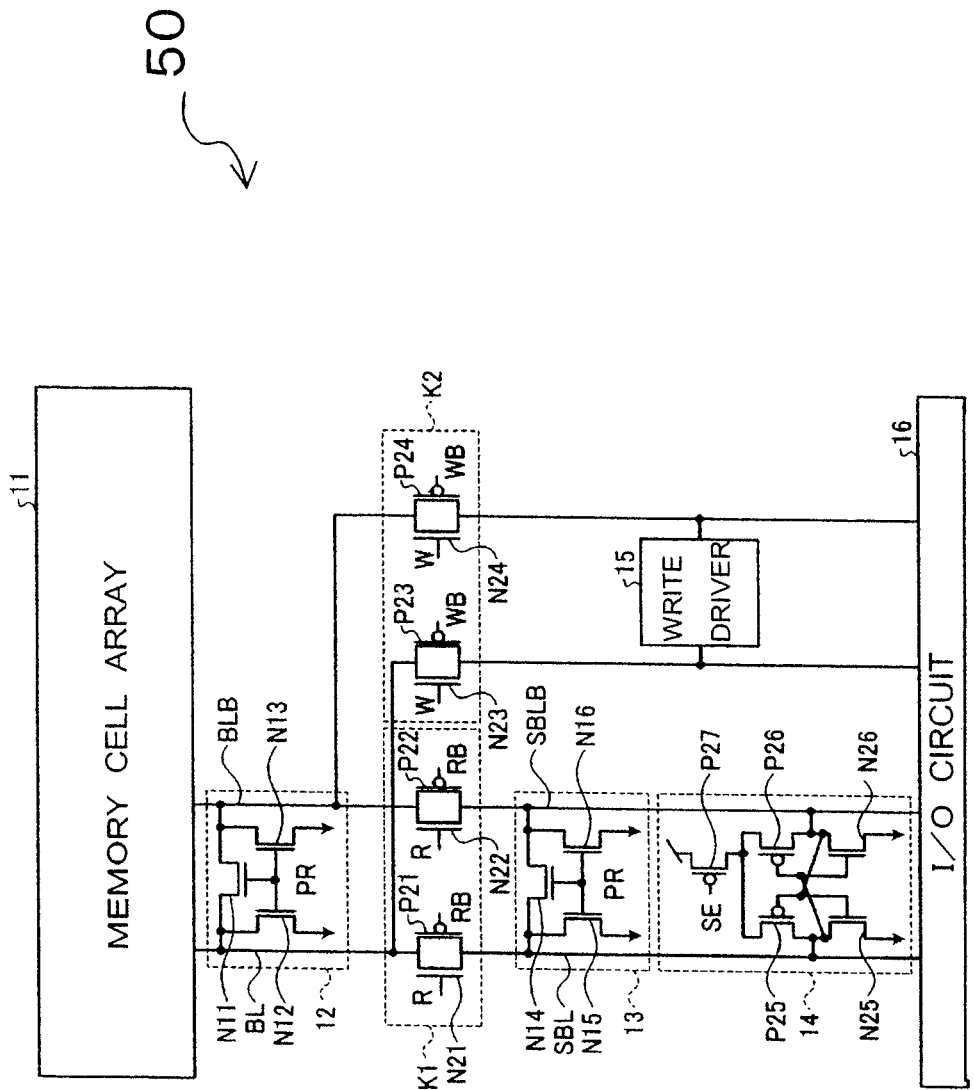
FIG. 5 is a circuit diagram showing a schematic configuration of a sense amplifier unit of a semiconductor memory device according to a second embodiment of the invention.

The semiconductor memory device according to a second embodiment of the invention will be described with reference to the drawings. FIG. 5 is a circuit diagram showing a schematic configuration of a sense amplifier unit of the semiconductor memory device.

As shown in FIG. 5, a semiconductor memory device 50 includes a memory cell array 11, a precharger 12, a precharger 13, a connection switch K1, a connection switch K2, a sense amplifier 14, a write driver 15, and an I/O circuit 16.

In the memory cell array 11, the SRAM cells 70 shown in FIG. 1 are arranged in the form of a matrix in a row direction and a column direction. The precharger 12 is connected between the bit lines BL, BLB. The precharger 12 can precharge the bit lines BL, BLB to a low level in a data read state from the memory cell.

In the precharger 12, N-channel insulated gate field effect transistors N11 to N13 are arranged. The gates of the N-channel insulated gate field effect transistors N11 to N13 are commonly connected, and a precharge signal PR is input to the gates of the N-channel insulated gate field effect transistors N11 to N13. The N-channel insulated gate field effect transistor N11 is connected between the bit lines BL, BLB. The drain of the N-channel insulated gate field effect transistor N12 is connected to the bit line BL. The drain of the N-channel insulated gate field effect transistor N13 is connected to the bit line BLB.

The bit lines BL, BLB are connected to sense bit lines SBL, SBLB through the connection switch K1, respectively. The connection switch K1 can connect the bit lines BL, BLB to the sense bit lines SBL, SBLB in a data read state from the SRAM cell 70. In the connection switch K1, N-channel insulated gate field effect transistors N21, N22 and P-channel insulated gate field effect transistors P21, P22 are arranged. The N-channel insulated gate field effect transistor N21 and the P-channel insulated gate field effect transistor P21 are connected between the bit line BL and the sense bit line SBL. The N-channel insulated gate field effect transistor N22 and the P-channel insulated gate field effect transistor P22 are connected between the bit line BLB and the sense bit line SBLB. A read signal R is input to the gates of the N-channel insulated gate field effect transistors N21, N22. A read inverted signal RB is input to the gates of the P-channel insulated gate field effect transistors P21, P22.

The precharger 13 is connected between the sense bit lines SBL, SBLB. The precharger 13 can precharge the sense bit lines SBL, SBLB to a low level in a data read state from the SRAM cell 70. In the precharger 13, N-channel insulated gate field effect transistors N14 to N16 are arranged. The gates of the N-channel insulated gate field effect transistors N14 to N16 are commonly connected. The precharge signal PR is input to the gates of the N-channel insulated gate field effect transistors N14 to N16. The N-channel insulated gate field effect transistor N14 is connected between the sense bit lines SBL, SBLB. The drain of the N-channel insulated gate field effect transistor N15 is connected to the sense bit line SBL. The drain of the N-channel insulated gate field effect transistor N16 is connected to the sense bit line SBLB.

The sense amplifier 14 is connected between the sense bit lines SBL, SBLB. The sense amplifier 14 amplifies a signal read from the SRAM cell 70. In the sense amplifier 14, N-channel insulated gate field effect transistors N25, N26 and P-channel insulated gate field effect transistors P25, P26 are arranged.

The N-channel insulated gate field effect transistor N25 and the P-channel insulated gate field effect transistor P25 are connected in series with each other to configure a CMOS inverter. The N-channel insulated gate field effect transistor N26 and the P-channel insulated gate field effect transistor P26 are connected in series with each other to configure a CMOS inverter. Outputs and inputs of one pair of CMOS inverters are cross-coupled with each other to configure a flip-flop. The drain of the N-channel insulated gate field effect transistor N25 and the drain of the P-channel insulated gate field effect transistor P25 are connected to the sense bit line SBL. The drain of the N-channel insulated gate field effect transistor N26 and the drain of the P-channel insulated gate field effect transistor P26 are connected to the sense bit line SBLB.

In the sense amplifier 14, a P-channel insulated gate field effect transistor P27 which supplies a voltage source potential to operate the sense amplifier 14 is arranged. The drain of the P-channel insulated gate field effect transistor P27 is connected to the source of the P-channel insulated gate field effect transistor P25 and the source of the P-channel insulated gate field effect transistor P26. A sense amplifier enable signal SE is input to the gate of the P-channel insulated gate field effect transistor P27.

The bit lines BL, BLB are connected to the write driver 15 through the connection switch K2. The write driver 15 writes data in the memory cell. The connection switch K2 connects the bit lines BL, BLB to the write driver 15 in a data write state to the SRAM cell 70.

In the connection switch K2, N-channel insulated gate field effect transistors N23, N24 and P-channel insulated gate field effect transistors P23, P24 are arranged. The N-channel insulated gate field effect transistor N23 and the P-channel insulated gate field effect transistor P23 are connected between the bit line BL and the write driver 15. The N-channel insulated gate field effect transistor N24 and the P-channel insulated gate field effect transistor P24 are connected between the bit line BLB and the write driver 15. A write signal W is input to the gates of the N-channel insulated gate field effect transistors N23, N24, and a write inverted signal WB is input to the gates of the P-channel insulated gate field effect transistors P23, P24.

The write driver 15 and the sense bit lines SBL, SBLB are connected to the I/O circuit 16. The I/O circuit 16 performs an input/output processing of read data and write data.

When data is stored in the SRAM cell 70, the read signal R and the write signal W are kept at a low level, and the read inverted signal RB and the write inverted signal WB are kept at a high level. For this reason, all the N-channel insulated gate field effect transistors N21 to N24 and all the P-channel insulated gate field effect transistors P21 to P24 are turned off, and the bit lines BL, BLB are separated from the sense bit lines SBL, SBLB and the write driver 15.

When data is read from the SRAM cell 70, the precharge signal PR shifts from a low level to a high level. When the precharge signal PR shifts from the low level to the high level, all the N-channel insulated gate field effect transistors N11 to N13 are turned on, and the bit lines BL, BLB are electrically connected to the voltage source potential VSS. As a result, the potentials of the bit lines BL, BLB are set to a low level. When the precharge signal PR shifts from a low level to a high level, all the N-channel insulated gate field effect transistors N14 to N16 are turned on, and the sense bit lines SBL, SBLB are electrically connected to the voltage source potential VSS, so that the potentials of the sense bit lines SBL, SBLB are set to a low level.

In a state in which the potential of the write word line WWL shown in FIG. 1 is set to a low level, when the potential of the read word line RWL shifts from a low level to a high level, the access transistors N6, N7 are turned on, and the sources of the read drive transistors N4, N5 are electrically connected to the bit lines BL, BLB, respectively.

When the sources of the read drive transistors N4, N5 are electrically connected to the bit lines BL, BLB, respectively, the potentials of the bit lines BL, BLB change depending on the data stored in the memory cell.

When the potentials of the bit lines BL, BLB change depending on the data stored in the SRAM cell 70, the read signal R shifts from a low level to a high level, and the read inverted signal RB shifts from a high level to a low level. For this reason, all the N-channel insulated gate field effect transistors N21, N22 and all the P-channel insulated gate field effect transistors P21, P22 are turned on, and the bit lines BL, BLB are electrically connected to the sense bit lines SBL, SBLB, respectively.

When the bit lines BL, BLB are electrically connected to the sense bit lines SBL, SBLB, respectively, the potentials of the bit lines BL, BLB are transmitted to the sense bit lines SBL, SBLB, respectively.

A predetermined period of time elapses after discharging from the bit lines BL, BLB is started, then the sense amplifier enable signal SE shifts from a high level to a low level, and the P-channel insulated gate field effect transistor P27 is turned on, and a voltage source potential is supplied to the source of the P-channel insulated gate field effect transistor P25 and the source of the P-channel insulated gate field effect transistor P26. When the sense amplifier enable signal SE shifts from a high level to a low level, the read signal R is shifted from a high level to a low level, and the read inverted signal RB is shifted from a low level to a high level. For this reason, all the N-channel insulated gate field effect transistors N21, N22 and all the P-channel insulated gate field effect transistors P21, P22 are turned off, and the bit lines BL, BLB are disconnected from the sense bit lines SBL, SBLB, respectively.

When a voltage source potential is supplied to the source of the P-channel insulated gate field effect transistor P25 and the source of the P-channel insulated gate field effect transistor P26, the potentials of the sense bit lines SBL, SBLB change depending on data stored in a memory cell while amplifying the potentials of the sense bit lines SBL, SBLB by the sense amplifier 14, and the potentials are output to the I/O circuit 16.

When data is written in the SRAM cell 70, the write signal W is shifted from a low level to a high level, and the write inverted signal WB is shifted from a high level to a low level. As a result, all the N-channel insulated gate field effect transistors N23, N24 and all the P-channel insulated gate field effect transistors P23, P24 are turned on, and the bit lines BL, BLB are connected to the write driver 15.

When the bit lines BL, BLB are connected to the write driver 15, the potential of one of the bit lines BL, BLB is set to a low level depending on write data, and the potential of the other of the bit lines BL, BLB is set to a high level. When the potentials of the read word line RWL and the write word line WWL shown in FIG. 1 shift from a low level to a high level, the access transistors N6, N7 and the write access transistors N2, N3 are turned on, and the potentials of the storage nodes V0, V1 change depending on the potentials of the bit lines BL, BLB, so that the write data is written in the SRAM cell 70.

The connection switch K1 is inserted between the bit lines BL, BLB and the sense bit lines SBL, SBLB. When the sense amplifier 14 is operated, the bit lines BL, BLB are disconnected from the sense bit lines SBL, SBLB, so that the bit lines BL, BLB need not be discharged by the sense amplifier 14. For this reason, when a signal read from the SRAM cell 70 is amplified by the sense amplifier 14, a load on the sense amplifier 14 can be reduced, and an operation speed of the sense amplifier 14 can be increased.

Figure 6:
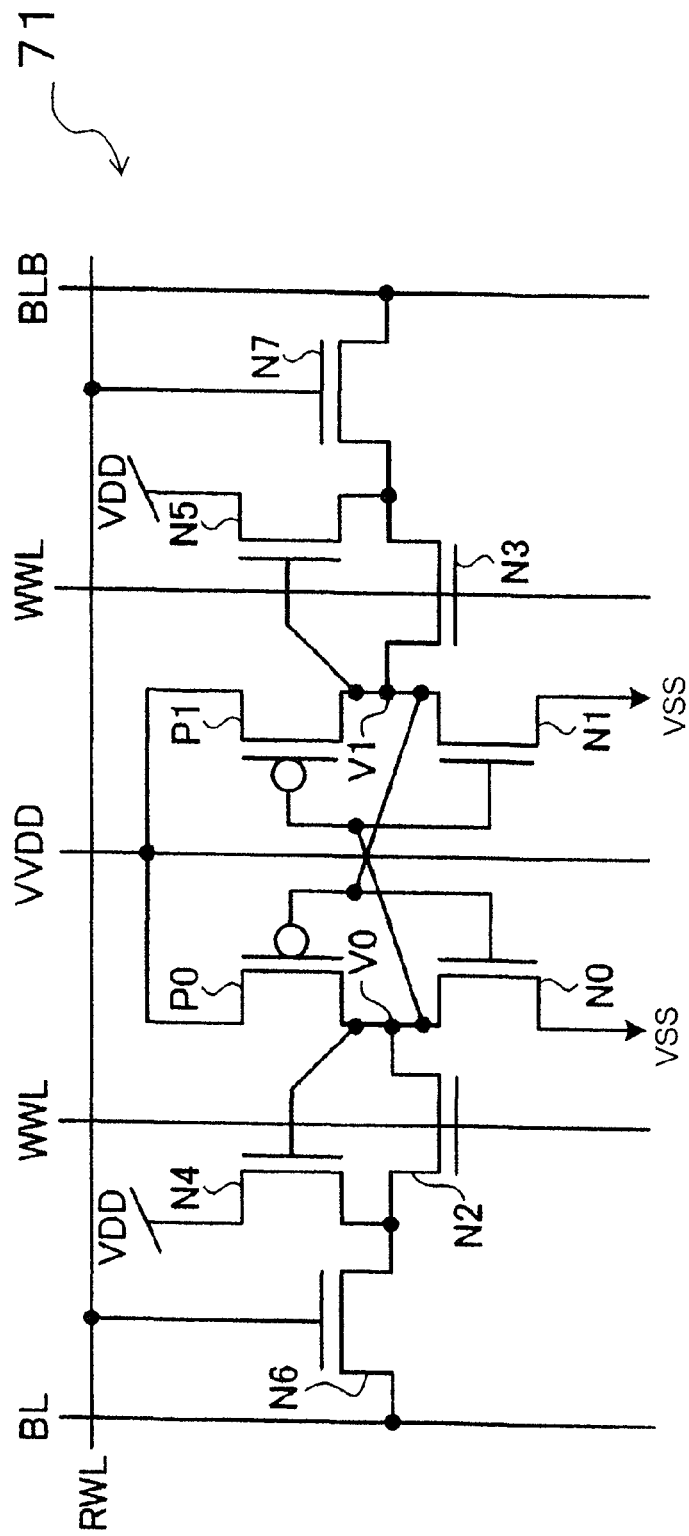
FIG. 6 is a circuit diagram showing a schematic configuration of a memory cell of a semiconductor memory device according to a third embodiment of the invention.

A semiconductor memory device according to a third embodiment of the invention will be described with reference to the drawings. FIG. 6 is a circuit diagram showing a schematic configuration of a memory cell of the semiconductor memory device. In the embodiment, a voltage source potential supplied to one pair of inverters is changed.

The same reference numerals as in the first embodiment denote the same portions in the third embodiment. The same portions will not be described, and only different portions will be described.

As shown in FIG. 6, an SRAM cell 71 used in the semiconductor memory device includes one pair of drive transistors N0, N1, one pair of load transistors P0, P1, one pair of write access transistors N2, N3, one pair of read drive transistors N4, N5, and one pair of access transistors N6, N7. The voltage source potential VDD is supplied to the SRAM cell 71 and it has a voltage source line VVDD. The voltage source line VVDD is arranged in parallel to the bit lines BL, BLB. The voltage source line VVDD is connected to the source of the load transistor P0 and the source of the load transistor P1.

Figure 7:
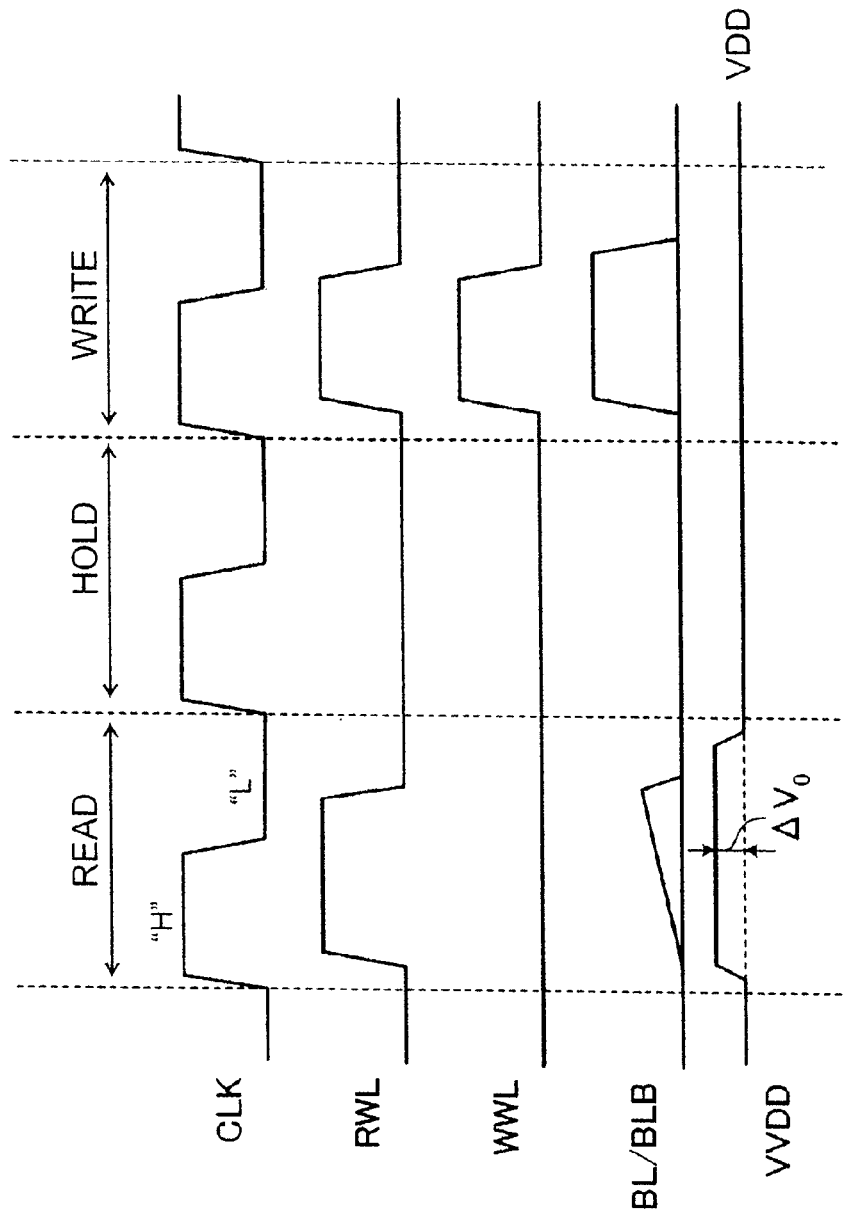
FIG. 7 is a timing chart showing waveforms of units in an operation state of the semiconductor memory device according to the third embodiment of the invention.

An operation of the semiconductor memory device will be described with reference to FIG. 7. FIG. 7 is a timing chart showing waveforms of units in an operation state of the semiconductor memory device.

As shown in FIG. 7, in a period in which data is stored in the SRAM cell 71 and when data is written in the SRAM cell 71, the SRAM cell 71 operates in the same manner as that of the SRAM cell 70 shown in FIG. 1 except that the potential of the voltage source line VVDD is set to the voltage source potential VDD.

When data is read from the SRAM cell 71, the potential of the voltage source line VVDD is raised to a voltage source potential $VDD+\Delta V_0$. In a state in which the potential of the voltage source line VVDD is raised to the voltage source potential $VDD+\Delta V_0$, the SRAM cell 71 operates in the same manner as that of the SRAM cell 70 shown in FIG. 1. As a result, data is read from the SRAM cell 71.

When data is read from the SRAM cell 71, the potential of the voltage source line VVDD is raised to the voltage source potential $VDD+\Delta V_0$ to make it possible to increase a read current, so that a read operation can be performed at a high speed.

When the voltage of the voltage source line VVDD is boosted, a boost voltage $\Delta V_0$ of the voltage source line VVDD, a capacitance of the voltage source line VVDD, and an operation frequency are set to 0.3 V, 1f F, and 100 MHz, respectively, and 128 memory cells are connected to each column. In this state, a current consumption in a read state becomes about 8 μA. When a common source line which switches of source potentials of the read drive transistors N4, N5 in a data read state and a data write state is arranged, and when 128 SRAM cells are connected to each row, a current of 5 mA flows every switching operation in a read state. For this reason, even though the voltage of the voltage source line VVDD is boosted, a current consumption can be made sufficiently smaller than that in the method in which the potentials of the common source line are switched.

Figure 8:
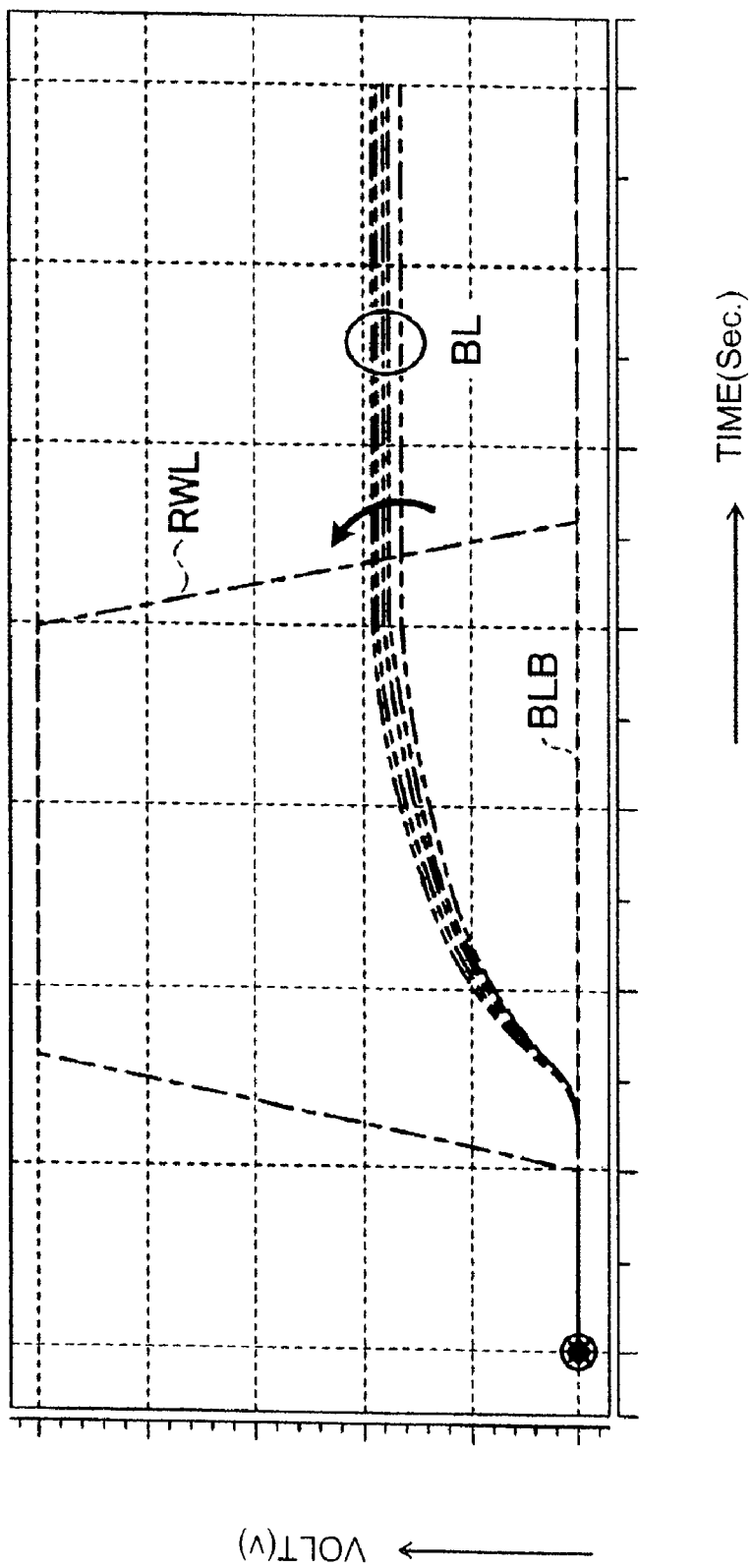
FIG. 8 is a diagram showing a simulation result of rising of a bit line potential in a data read state of the semiconductor memory device according to the third embodiment of the invention.
Figure 9:
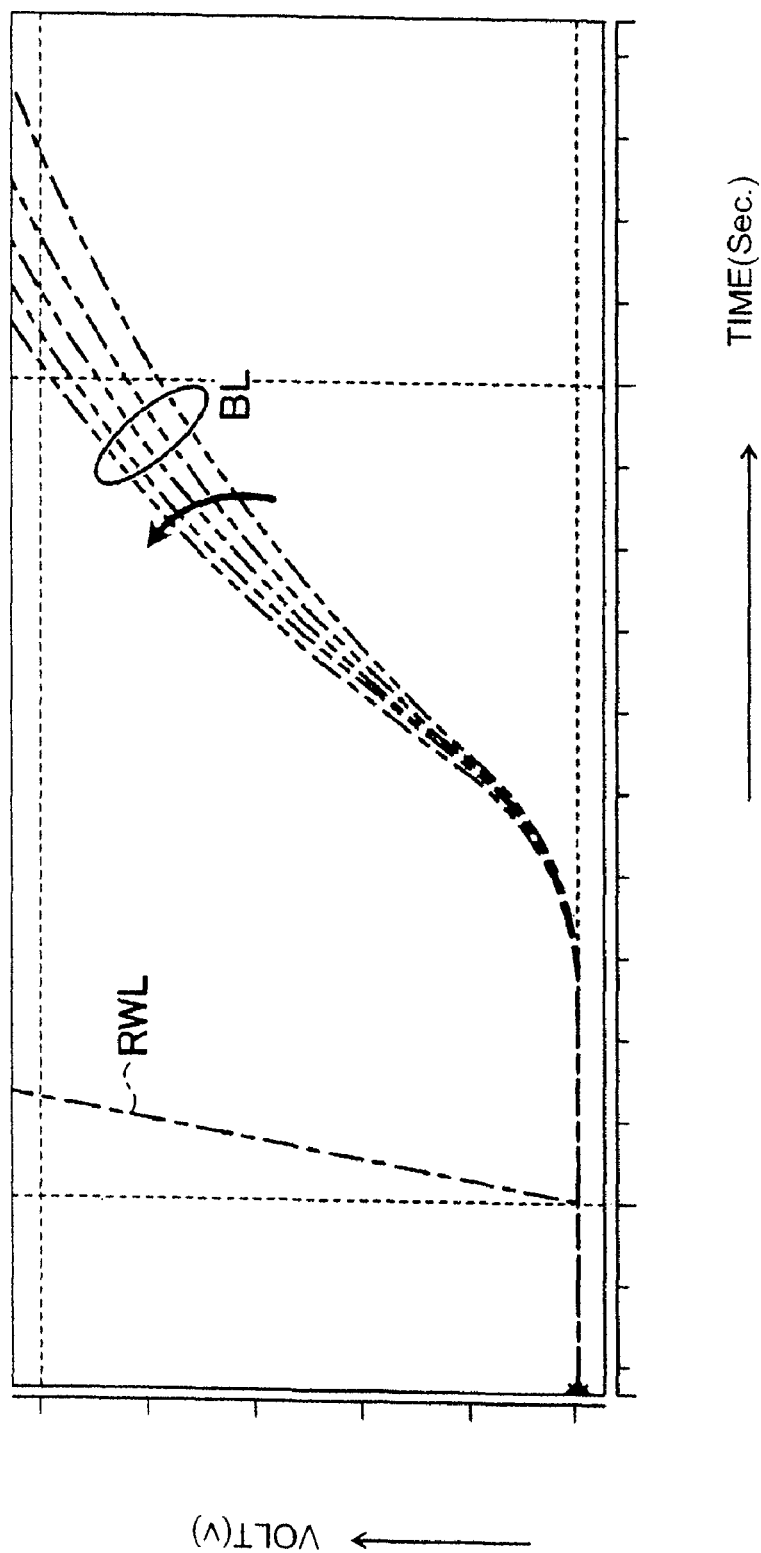
FIG. 9 is an enlarged diagram showing the waveform in FIG. 8.

Data reading from the semiconductor memory device having the SRAM cell 71 will be described with reference to FIGS. 8 and 9. FIG. 8 is a diagram showing a simulation result of rising of a bit line potential in a data read state of the semiconductor memory device having the SRAM cell 71. FIG. 9 is an enlarged diagram showing the waveform of the semiconductor memory device having the SRAM cell 71.

As shown in FIGS. 8 and 9, by setting the boost voltage $\Delta V_0$ of the voltage source line VVDD to 0 V to 0.2 V, a potential of the bit line BL when data is read from the SRAM cell 71 is raised, and a rising rate of the potential of the bit line BL can be increased. For example, by setting the boost voltage $\Delta V_0$ of the voltage source line VVDD to 0.2 V, a read current can be increased by 32.7%.

Figure 10:
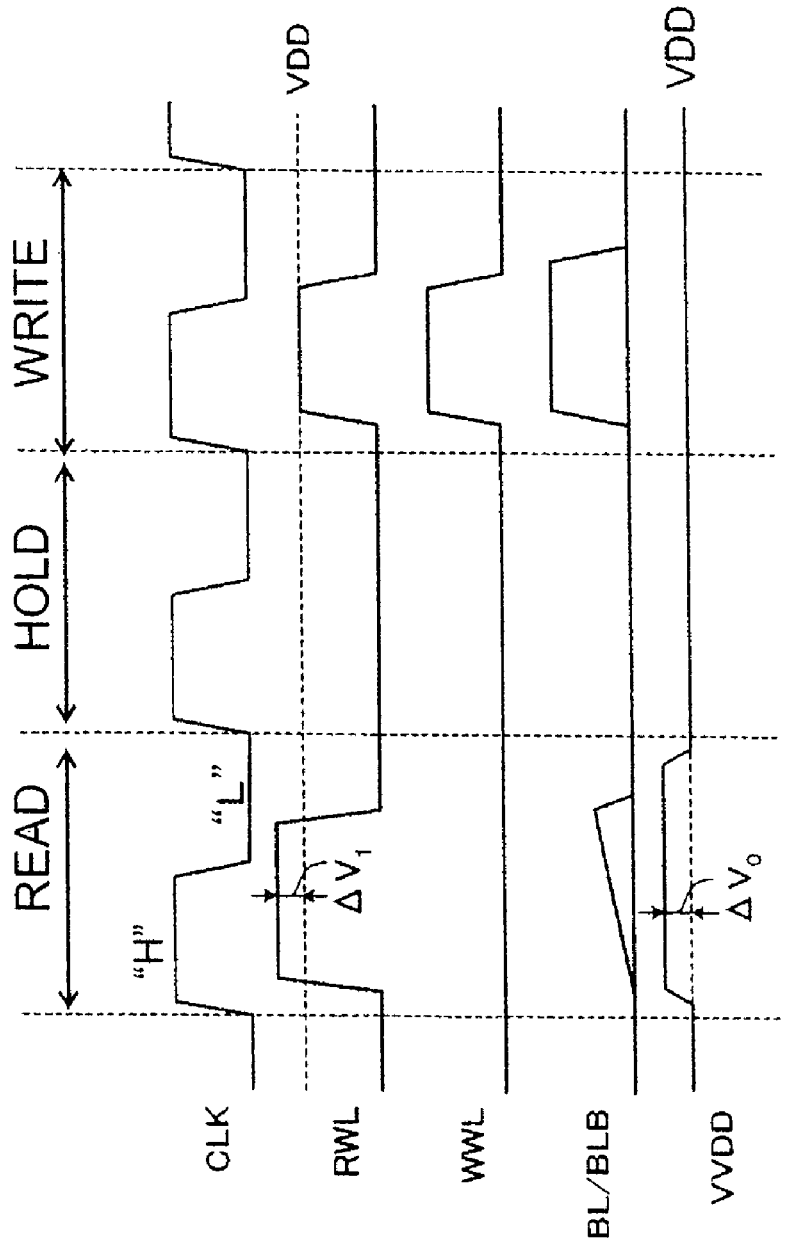
FIG. 10 is a timing chart showing waveforms of units in an operation state of a semiconductor memory device according to a fourth embodiment of the invention.

A semiconductor memory device according to a fourth embodiment of the invention will be described with reference to the drawings. FIG. 10 is a timing chart showing waveforms of units in an operation state of the semiconductor memory device. In the embodiment, when data is read, the potential of the read word line RWL is set to be higher than the voltage source potential VDD.

As shown in FIG. 10, in a period in which data is stored in the SRAM cell 71 shown in FIG. 6 and when the data is written in the SRAM cell 71, the same operation as that expressed by the timing chart shown in FIG. 7 is performed.

When data is read from the SRAM cell 71, the potential of the read word line RWL is raised to the voltage source potential VDD+$\Delta V_1$. In the state in which the potential of the read word line RWL is raised to the voltage source potential VDD+$\Delta V_1$, the same operation as that expressed by the timing chart shown in FIG. 7 is performed to read the data from the SRAM cell 71.

When the data is read from the SRAM cell 71 here, the potential of the read word line RWL is raised to the voltage source potential VDD+$\Delta V_1$ to make it possible to further increase a read current, and a speed of a read operation can be further increased.

Figure 11:
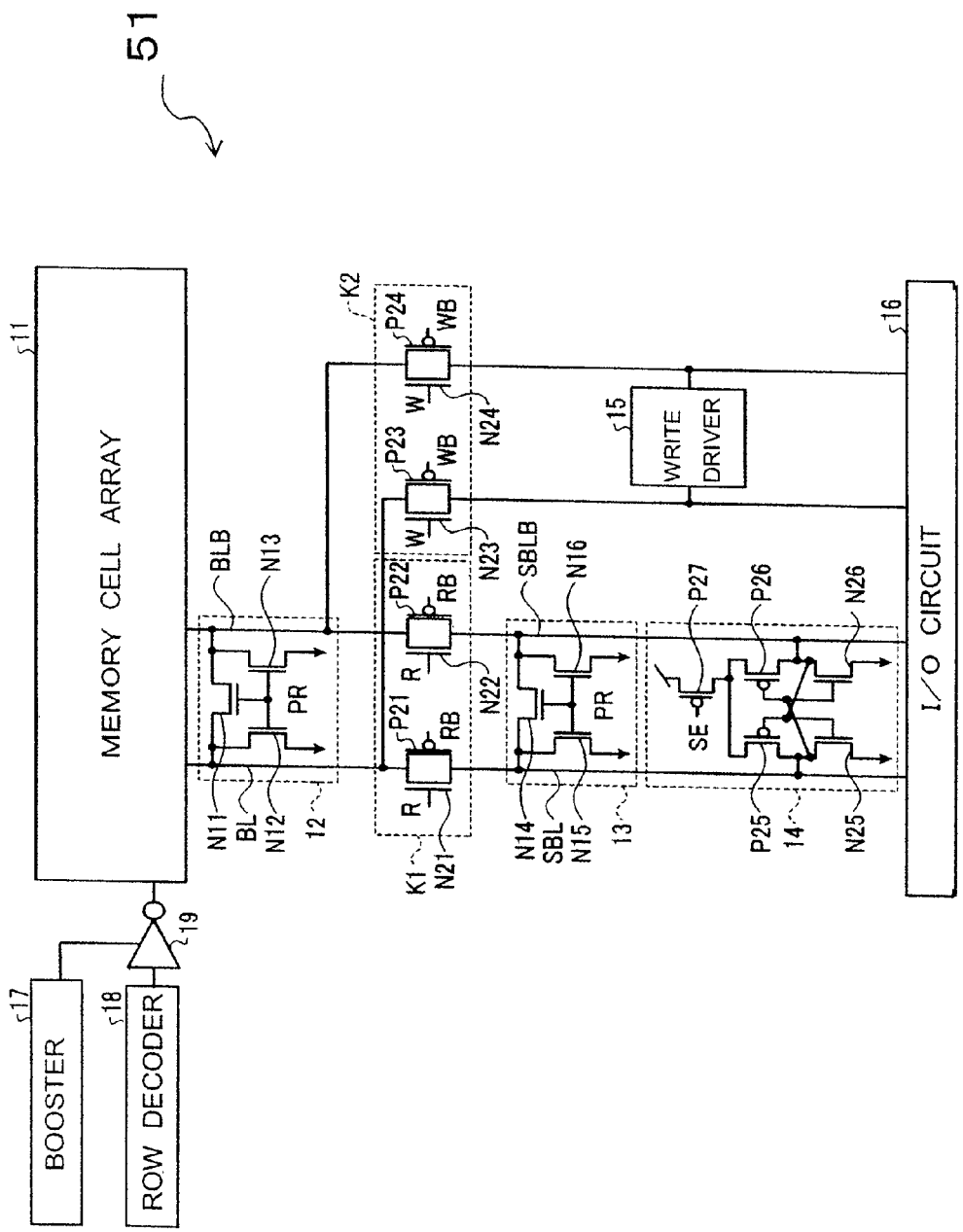
FIG. 11 is a block diagram showing a schematic configuration of a word line drive circuit of a semiconductor memory device according to a fifth embodiment of the invention.

A semiconductor memory device according to a fifth embodiment of the invention will be described with reference to the drawings. FIG. 11 is a block diagram showing a schematic configuration of a word line drive circuit of the semiconductor memory device. In the embodiment, a booster and a low decoder are provided.

The same reference numerals as in the second embodiment denote the same portions in the fifth embodiment. The same portions will not be described, and only different portions will be described.

As shown in FIG. 11, a semiconductor memory device 51 includes a memory cell array 11, a precharger 12, a precharger 13, a connection switch K1, a connection switch K2, a sense amplifier 14, a write driver 15, a I/O circuit 16, a booster 17, a row decoder 18, and an inverter 19.

The booster 17, the row decoder 18, and the inverter 19 function as word line drive circuits. The booster 17 boosts a voltage source potential supplied to the inverter 19. The row decoder 18 is connected to the read word line RWL through the inverter 19. The row decoder 18 and the inverter 19 select rows.

When data is read from the SRAM cell 71 shown in FIG. 6, the voltage source potential VDD is raised to voltage source potential VDD+$\Delta V_1$ at the booster 17 and supplied as a voltage source of the inverter 19. When the read word line RWL of the SRAM cell 71 is selected by the row decoder 18, the voltage source potential VDD+$\Delta V_1$ is applied to the read word line RWL. In the state in which the voltage source potential VDD+$\Delta V_1$ is applied to the read word line RWL, by the same operation as that expressed by the timing chart shown in FIG. 10, data is read from the SRAM cell 71.

Here, the method of mounting the booster 17 on a semiconductor chip on which the semiconductor memory device 51 is formed to raise the potential of the read word line RWL is described. However, a pad electrode to apply the voltage source potential VDD+$\Delta V_1$ may be arranged on the semiconductor chip, and the voltage source potential VDD+$\Delta V_1$ may be applied to the read word line RWL through the pad electrode.

Figure 12:
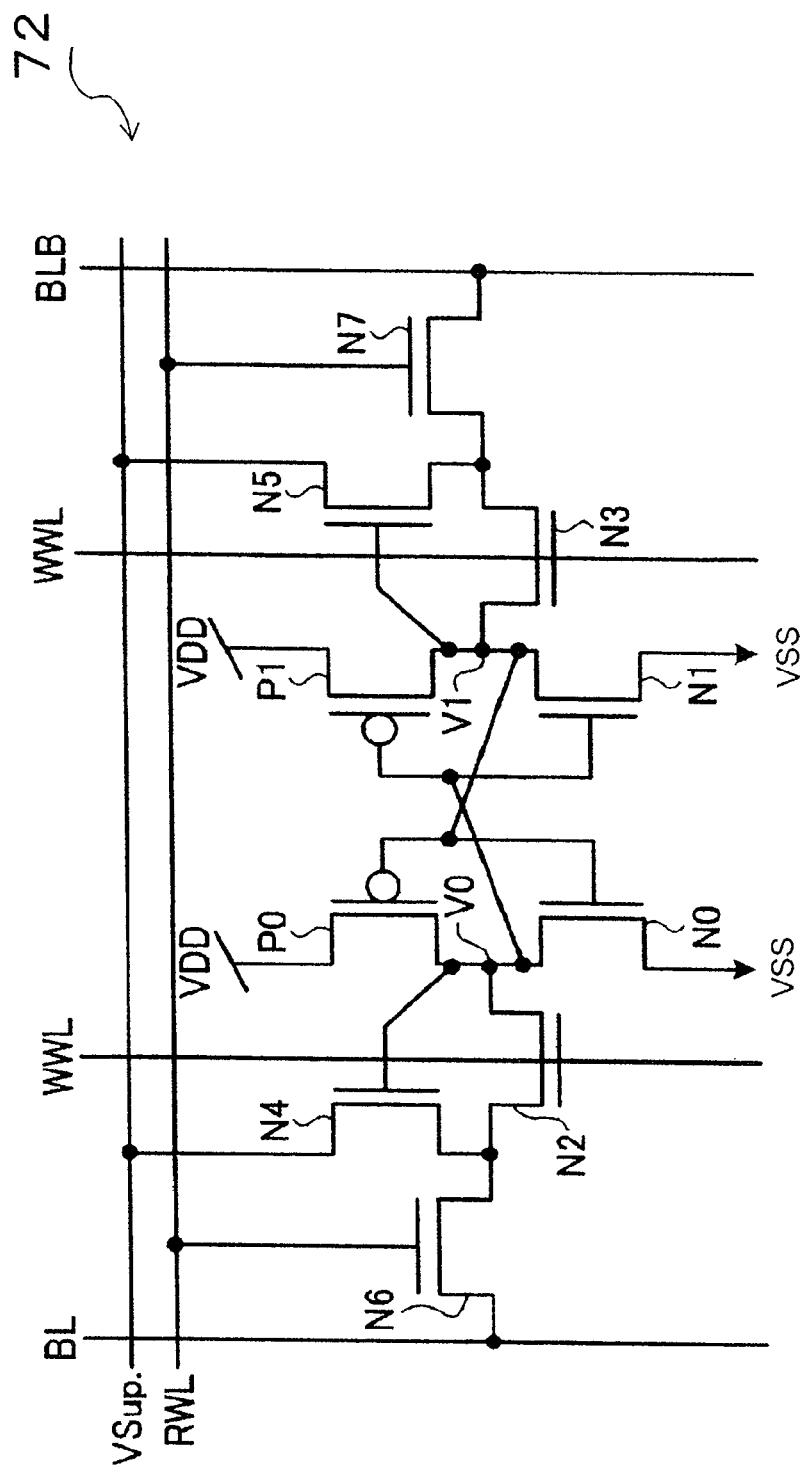
FIG. 12 is a circuit diagram showing a schematic configuration of a memory cell of a semiconductor memory device according to a sixth embodiment of the invention.

A semiconductor memory device according to a sixth embodiment will be described with reference to the drawings. FIG. 12 is a circuit diagram showing a schematic configuration of a memory cell of the semiconductor memory device. In the embodiment, a drain of one pair of read drive transistors is connected to a secondary voltage source line.

The same reference numerals as in the first embodiment denote the same portions in the sixth embodiment. The same portions will not be described, and only different portions will be described.

As shown in FIG. 12, an SRAM cell 72 used in the semiconductor memory device includes one pair of drive transistors N0, N1, one pair of load transistors P0, P1, one pair of write access transistors N2, N3, one pair of read drive transistors N4, N5, and one pair of access transistors N6, N7. The voltage source potential VDD is supplied to the SRAM cell 72, and a secondary voltage source line VSup. is arranged. The secondary voltage source line VSup. is arranged in parallel to the read word line RWL. The secondary voltage source line VSup. is connected to the drains of the read drive transistors N4, N5.

Figure 13:
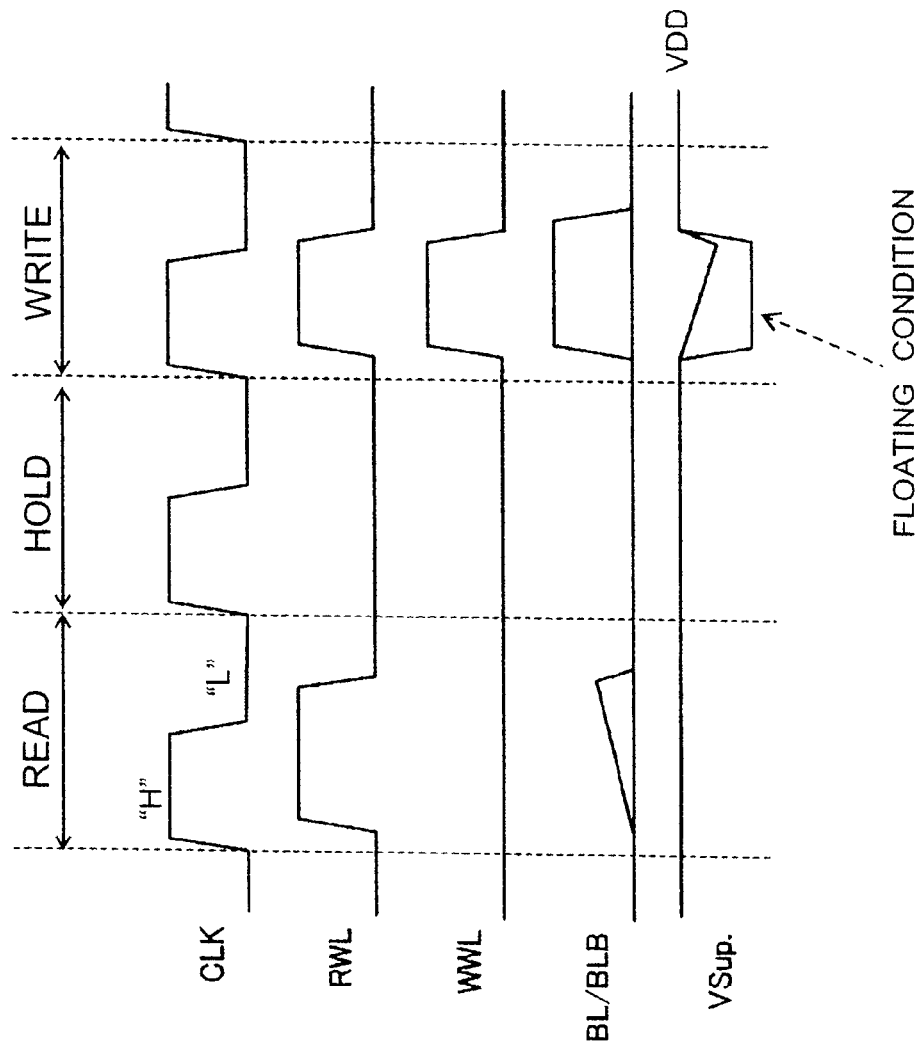
FIG. 13 is a timing chart showing waveforms of units in an operation state of the semiconductor memory device according to the sixth embodiment of the invention.

An operation of the semiconductor memory device will be described with reference to FIG. 13. FIG. 13 is a timing chart showing waveforms of units in an operation state of the semiconductor memory device.

As shown in FIG. 13, in a period in which data is stored in the SRAM cell 72 and when data is read from the SRAM cell 72, the SRAM cell 72 operates in the same manner as that of the SRAM cell 70 shown in FIG. 1 except that the potential of the secondary voltage source line VSup. is set to the voltage source potential VDD.

When data is written in the SRAM cell 72, the potential of the secondary voltage source line VSup. is shifted to a floating condition. In a state which the potential of the secondary voltage source line VSup. is shifted to the floating condition, the SRAM cell 72 is operated in the same manner as that of the SRAM cell 70 shown in FIG. 1 to write data in the SRAM cell 72.

When the data is written in the SRAM cell 72, the potential of the secondary voltage source line VSup. is shifted to a floating condition to make it possible to decrease the driving performance of the read drive transistors N4, N5. For this reason, data can be suppressed from being prevented by the read drive transistors N4, N5 from being written. Also when writing is performed through the write access transistors N2, N3 and the access transistors N6, N7, data can be easily written in the SRAM cell 72.

In the embodiment, the method of additionally arranging the secondary voltage source line VSup. in the configuration shown in FIG. 1 is described. The voltage source line VVDD shown in FIG. 6 may be arranged in the configuration shown in FIG. 12.

Figure 14:
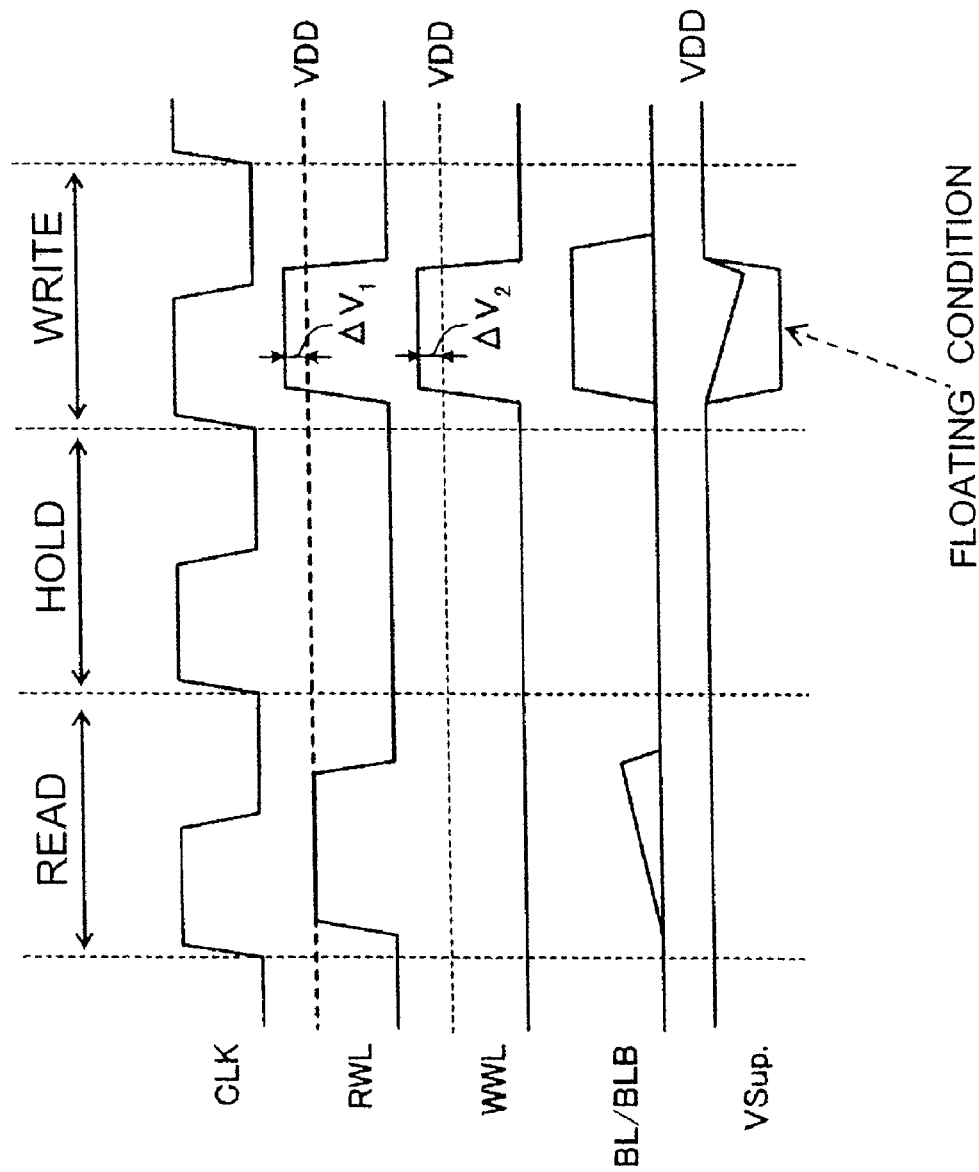
FIG. 14 is a timing chart showing waveforms of units in an operation state of a semiconductor memory device according to a seventh embodiment of the invention.

A semiconductor memory device according to a seventh embodiment of the invention will be described with reference to the drawings. FIG. 14 is a timing chart showing waveforms of units in an operation state of the semiconductor memory device. In the embodiment, the potentials of the read word line RWL and the write word line WWL are set to be higher than the voltage source potential in a data write state.

As shown in FIG. 14, in a period in which data is stored in the SRAM cell 72 shown in FIG. 12 and when the data is read from the SRAM cell 72, the same operation as that expressed by the timing chart shown in FIG. 13 is performed.

When data is written in the SRAM cell 72, the potential of the read word line RWL is raised to the voltage source potential VDD+$\Delta V_1$, and the potential of the write word line WWL is raised to a voltage source potential VDD+$\Delta V_2$. In the state in which the potential of the read word line RWL is raised to the voltage source potential VDD+$\Delta V_1$ and the potential of the write word line WWL is raised to the voltage source potential VDD+$\Delta V_2$, the same operation as that expressed by the timing chart shown in FIG. 13 is performed to write data in the SRAM cell 72.

When data is written in the SRAM cell 72, the potential of the read word line RWL is raised to the voltage source potential VDD+$\Delta V_1$, and the potential of the write word line WWL is raised to the voltage source potential VDD+$\Delta V_2$. For this reason, the driving performance of the write access transistors N2, N3 and the access transistors N6, N7 can be increased, and data can be easily written in the memory cell.

Figure 15:
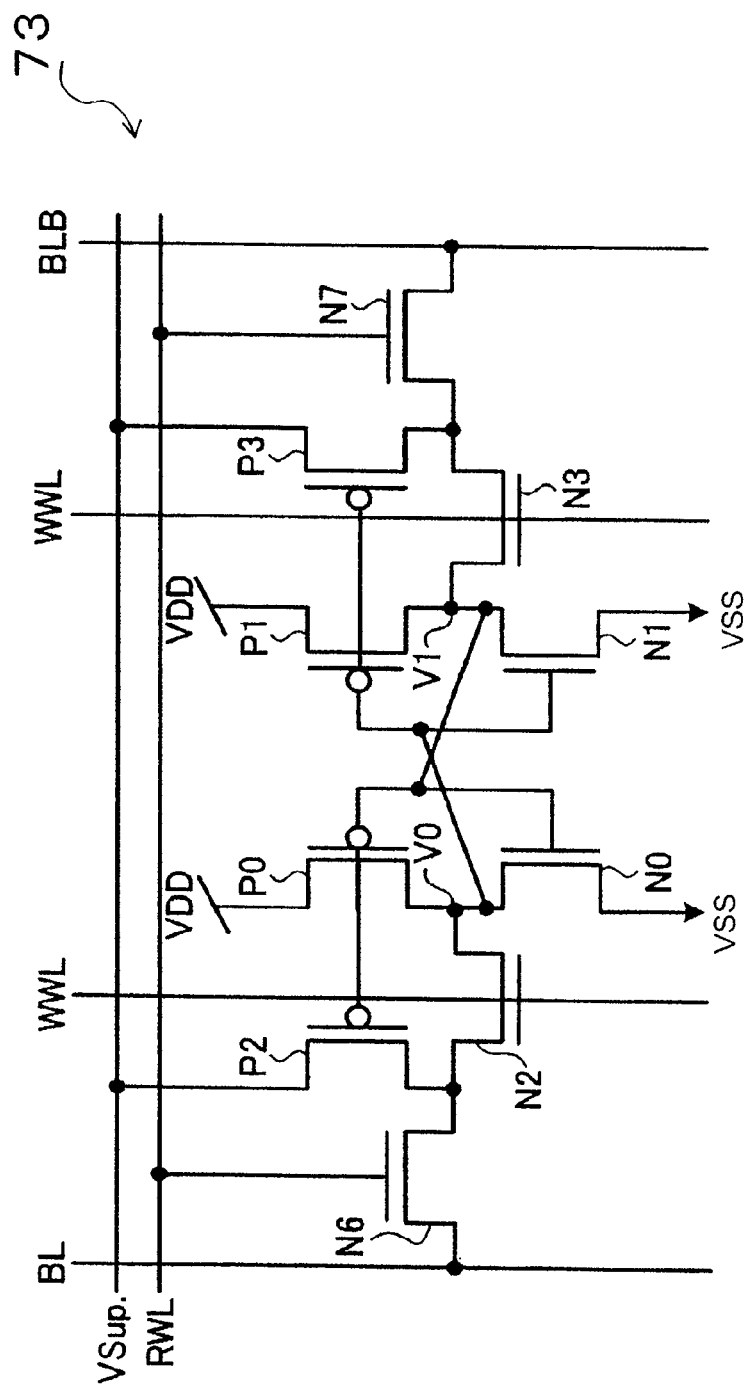
FIG. 15 is a circuit diagram showing a schematic configuration of a memory cell of a semiconductor memory device according to an eighth embodiment of the invention.

A semiconductor memory device according to an eighth embodiment of the invention will be described with reference to the drawings. FIG. 15 is a circuit diagram showing a schematic configuration of a memory cell of the semiconductor memory device. In the embodiment, one pair of read drive transistors is P-channel insulated gate field effect transistors.

The same reference numerals as in the sixth embodiment denote the same portions in the eighth embodiment. The same portions will not be described, and only different portions will be described.

As shown in FIG. 15, an SRAM cell 73 used in the semiconductor memory device includes one pair of drive transistors N0, N1, one pair of load transistors P0, P1, one pair of write access transistors N2, N3, one pair of read drive transistors P2, P3, and one pair of access transistors N6, N7. The voltage source potential VDD is supplied to the SRAM cell 73, and the secondary voltage source line VSup. is arranged in the SRAM cell 73. The secondary voltage source line VSup. is connected to the source of the read drive transistor P2 and the source of the read drive transistor P3. P-channel insulated gate field effect transistors are used as the read drive transistors P2, P3.

The drain of the read drive transistor P2 is connected to the source of the write access transistor N2. The gate of the read drive transistor P2 is connected to a gate of the load transistor P0. The source of the read drive transistor P2 is connected to the secondary voltage source line VSup.

The drain of the read drive transistor P3 is connected to the source of the write access transistor N3. The gate of the read drive transistor P3 is connected to the gate of the load transistor P1. The source of the read drive transistor P3 is connected to the secondary voltage source line VSup.. A read/write operation of the SRAM cell 73 shown in FIG. 15 is performed in the same manner as that expressed by the timing chart shown in FIG. 14.

Figure 16:
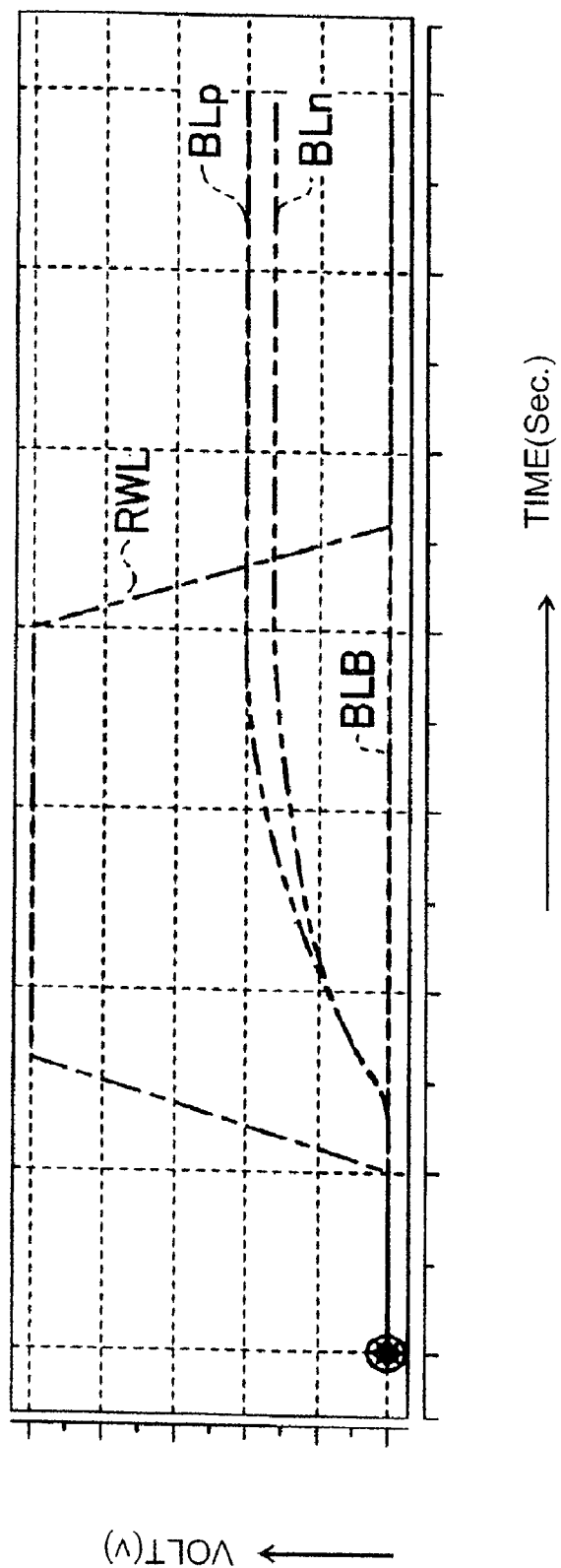
FIG. 16 is a diagram showing a simulation result of rising of a bit line potential in a data read state of the semiconductor memory device according to the eighth embodiment of the invention in comparison with the embodiment in FIG. 3.
Figure 17:
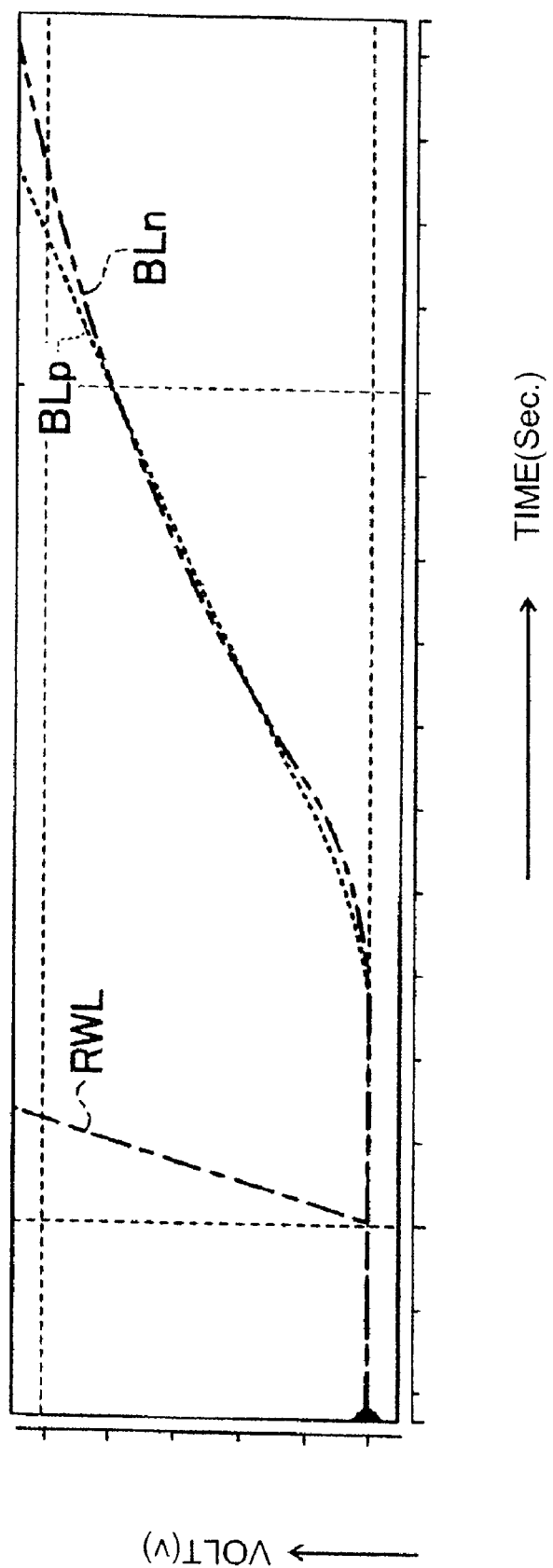
FIG. 17 is an enlarged diagram showing the waveform in FIG. 16.

A data read operation of the semiconductor memory device will be described with reference to FIGS. 16 and 17. FIG. 16 is a diagram showing a simulation result of rising of a bit line potential in a data read state of the semiconductor memory device in comparison with the first embodiment shown in FIG. 3. FIG. 17 is an enlarged diagram showing the waveform in FIG. 16.

As shown in FIGS. 16 and 17, P-channel insulated gate field effect transistors are used as the read drive transistors P2, P3 to make it possible to decrease the driving performance of the read drive transistors P2, P3. For this reason, data can be suppressed from being prevented by the read drive transistors P2, P3 from being written. As a result, when a write operation is performed through the write access transistors N2, N3 and the access transistors N6, N7, data can be easily written in the SRAM cell 73. A potential BLp of the bit line BL obtained when the read drive transistors P2, P3 shown in FIG. 15 are used can be raised in comparison with a potential BLn of the bit line BL obtained when the read drive transistors N4, N5 shown in FIG. 12 are used.

The invention is not limited to the above embodiments, and may be variably changed without departing from the spirit and scope of the invention.

In the eighth embodiment, the method of replacing the read drive transistors N4, N5 shown in FIG. 12 with the read drive transistors P2, P3 is described. However, the voltage source line VVDD shown in FIG. 6 may be arranged in the configuration shown in FIG. 15.

What is claimed is:
1. A semiconductor memory device comprising
a memory cell configured to store data,
wherein the memory cell comprises:
a first inverter comprising a first load transistor and a first drive transistor connected in series;
a second inverter comprising a second load transistor and a second drive transistor connected in series, comprising an output connected to an input of the first inverter, and an input connected to an output of the first inverter;
a first write access transistor comprising a drain connected to a gate of the second drive transistor, a gate of the second load transistor, a drain of the first drive transistor, and a drain of the first load transistor;
a second write access transistor comprising a drain connected to a drain of the second drive transistor, a drain of the second load transistor, a gate of the first drive transistor, and a gate of the first load transistor;
a first access transistor comprising a drain connected to a source of the first write access transistor;
a second access transistor comprising a drain connected to a source of the second write access transistor;
a first read drive transistor comprising a source connected to the source of the first write access transistor, a gate connected to the drain of the first write access transistor, and a drain set to a voltage source potential;
a second read drive transistor comprising a source connected to the source of the second write access transistor, a gate connected to the drain of the second write access transistor, and a drain set to the voltage source potential;
a write word line connected to a gate of the first write access transistor and a gate of the second write access transistor;
a read word line connected to a gate of the first access transistor and a gate of the second access transistor;
a first bit line connected to a source of the first access transistor; and
a second bit line connected to a source of the second access transistor.

2. The semiconductor memory device of claim 1, further comprising:
a first precharger configured to precharge the first bit line and the second bit line to a low level;
a sense amplifier configured to amplify a signal read from the memory cell;
a first and a second sense bit lines configured to transmit signals from the first and second bit lines to the sense amplifier;
a second precharger configured to precharge the first sense bit line and the second sense bit line to a low level;
a write driver configured to write data in the memory cell;
a first connection switch configured to connect the first and second bit lines to the first and second sense bit lines, respectively, when the data is read from the memory cell; and
a second connection switch configured to connect the first and second bit lines to the write driver when the data is written into the memory cell.

3. The semiconductor memory device of claim 2, further comprising a booster configured to boost a potential of the read word line from the voltage source potential when the data is read from the memory cell.

4. The semiconductor memory device of claim 1, wherein the sources of the first and second load transistors are set to the voltage source potential.

5. The semiconductor memory device of claim 1, wherein the sources of the first and second load transistors are connected to a voltage source line.

6. The semiconductor memory device of claim 5, wherein a potential of the voltage source line is higher than the voltage source potential when the data is read.

7. The semiconductor memory device of claim 6, wherein a potential of the read word line is higher than the voltage source potential when the data is read.

8. The semiconductor memory device of claim 1, wherein
the first and second load transistors are P-channel insulated gate field effect transistors, and
the first and second drive transistors, the first and second write access transistors, the first and second access transistors, and the first and second read access transistors are N-channel insulated gate field effect transistors.

9. The semiconductor memory device of claim 8, wherein the insulated gate field effect transistor is a MOS transistor or a MIS transistor.

10. A semiconductor memory device comprising:
a memory cell configured to store data,
wherein the memory cell comprises:
a first inverter comprising a first load transistor and a first drive transistor connected in series;
a second inverter comprising a second load transistor and a second drive transistor connected in series, comprising an output connected to an input of the first inverter, and an input connected to an output of the first inverter;
a first write access transistor comprising a drain connected to a gate of the second drive transistor, a gate of the second load transistor, a drain of the first drive transistor, and a drain of the first load transistor;
a second write access transistor comprising a drain connected to a drain of the second drive transistor, a drain of the second load transistor, a gate of the first drive transistor, and a gate of the first load transistor;
a first access transistor comprising a drain connected to a source of the first write access transistor;
a second access transistor comprising a drain connected to a source of the second write access transistor;
a first read drive transistor comprising a source connected to the source of the first write access transistor, a gate connected to the drain of the first write access transistor, and a drain connected to a secondary voltage source line;
a second read drive transistor comprising a source connected to the source of the second write access transistor, a gate connected to the drain of the second write access transistor, and a drain connected to the secondary voltage source line;
a write word line connected to a gate of the first write access transistor and a gate of the second write access transistor;
a read word line connected to a gate of the first access transistor and a gate of the second access transistor;
a first bit line connected to a source of the first access transistor; and
a second bit line connected to a source of the second access transistor.

11. The semiconductor memory device of claim 10, further comprising:
a first precharger configured to precharge the first bit line and the second bit line to a low level;
a sense amplifier configured to amplify a signal read from the memory cell;
a first and a second sense bit lines to transmit signals read to the first and second bit lines to the sense amplifier;
a second precharger configured to precharge the first sense bit line and the second sense bit line to a low level;
a write driver configured to write data in the memory cell;
a first connection switch configured to connect the first and second bit lines to the first and second sense bit lines, respectively, when the data is read from the memory cell; and
a second connection switch configured to connect the first and second bit lines to the write driver when the data is written into the memory cell.

12. The semiconductor memory device of claim 11, further comprising a booster configured to boost a potential of the read word line from the voltage source potential when the data is read from the memory cell.

13. The semiconductor memory device of claim 10, wherein the sources of the first and second load transistors are set to the voltage source potential.

14. The semiconductor memory device of claim 13, wherein a potential of the secondary voltage source line is set to a floating potential when the data is written.

15. The semiconductor memory device of claim 14, wherein potentials of the write word line and the read word line are set higher than the voltage source potential when the data is written.

16. The semiconductor memory device of claim 10, wherein
the first and second load transistors are P-channel insulated gate field effect transistors, and
the first and second drive transistors, the first and second write access transistors, the first and second access transistors, and the first and second read access transistors are N-channel insulated gate field effect transistors.

17. A semiconductor memory device comprising:
a memory cell configured to store data,
wherein the memory cell comprises:
a first inverter comprising a first load transistor and a first drive transistor connected in series;
a second inverter comprising a second load transistor and a second drive transistor connected in series, comprising an output connected to an input of the first inverter, and an input connected to an output of the first inverter;

a first write access transistor comprising a drain connected to a gate of the second drive transistor, a gate of the second load transistor, a drain of the first drive transistor, and a drain of the first load transistor;

a second write access transistor comprising a drain connected to a drain of the second drive transistor, a drain of the second load transistor, a gate of the first drive transistor, and a gate of the first load transistor;

a first access transistor comprising a drain connected to a source of the first write access transistor;

a second access transistor comprising a drain connected to a source of the second write access transistor;

a first read drive transistor comprising a drain connected to the source of the first write access transistor, a gate connected to a gate of the first load transistor, and a source connected to a secondary voltage source line;

a second read drive transistor comprising a drain connected to the source of the second write access transistor, a gate connected to a gate of the second load transistor, and a source connected to the secondary voltage source line;

a write word line connected to a gate of the first write access transistor and a gate of the second write access transistor;

a read word line connected to a gate of the first access transistor and a gate of the second access transistor;

a first bit line connected to a source of the first access transistor; and a second bit line connected to a source of the second access transistor.

18. The semiconductor memory device of claim 17, further comprising:

a first precharger configured to precharge the first bit line and the second bit line to a low level;

a sense amplifier configured to amplify a signal read from the memory cell;

a first and a second sense bit lines configured to transmit signals from the first and second bit lines to the sense amplifier;

a second precharger configured to precharge the first sense bit line and the second sense bit line to a low level;

a write driver configured to write data in the memory cell;

a first connection switch configured to connect the first and second bit lines to the first and second sense bit lines, respectively, when the data is read from the memory cell; and a second connection switch configured to connect the first and second bit lines to the write driver when the data is written into the memory cell.

19. The semiconductor memory device of claim 17, wherein
a potential of the secondary voltage source line is set to a floating potential when the data is written.

20. The semiconductor memory device of claim 17, wherein
the first and second load transistors and the first and second read drive transistors are P-channel insulated gate field effect transistors, and
the first and second drive transistors, the first and second write access transistors, and the first and second access transistor are N-channel insulated gate field effect transistors.

* * * * *